(12) United States Patent
Zhang et al.

(10) Patent No.: US 10,580,823 B2
(45) Date of Patent: Mar. 3, 2020

(54) WAFER LEVEL PACKAGING METHOD

(71) Applicant: United Microelectronics Corp., Hsinchu (TW)

(72) Inventors: Sheng Zhang, Singapore (SG); Wen-Bo Ding, Singapore (SG); Zhi-Rui Sheng, Singapore (SG); Chien-En Hsu, Singapore (SG); Chien-Kee Pang, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 52 days.

(21) Appl. No.: 15/586,102

(22) Filed: May 3, 2017

(65) Prior Publication Data

US 2018/0323227 A1 Nov. 8, 2018

(51) Int. Cl.
*H01L 27/146* (2006.01)
*H01L 23/00* (2006.01)

(52) U.S. Cl.
CPC .......... *H01L 27/1469* (2013.01); *H01L 24/89* (2013.01); *H01L 27/14685* (2013.01); *H01L 27/14687* (2013.01); *H01L 2224/8084* (2013.01); *H01L 2924/10253* (2013.01); *H01L 2924/10271* (2013.01); *H01L 2924/10272* (2013.01); *H01L 2924/10329* (2013.01); *H01L 2924/12043* (2013.01); *H01L 2924/13091* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 6,168,508 B1 * | 1/2001 | Nagahara | B24B 37/24 451/285 |
| 8,298,916 B2 | 10/2012 | Vaufredaz et al. | |
| 8,329,048 B2 | 12/2012 | Zussy et al. | |
| 8,476,165 B2 | 7/2013 | Trickett et al. | |
| 2008/0044984 A1 | 2/2008 | Hsieh et al. | |
| 2011/0117691 A1 * | 5/2011 | Broekaart | H01L 21/302 438/73 |

* cited by examiner

*Primary Examiner* — Anthony Ho
*Assistant Examiner* — Kevin Quinto
(74) *Attorney, Agent, or Firm* — J.C. Patents

(57) ABSTRACT

A wafer level packaging method includes the following steps. A first wafer is bonded over a second wafer. A first grinding process on the first wafer is performed, to remove an upper chamfered edge of the first wafer and reduce a thickness of the first wafer. A trimming process is performed on the first wafer, to remove a lower chamfered edge of the first wafer to form a trimmed first wafer. A second grinding process is performed on the trimmed first wafer, to reduce a thickness of the trimmed first wafer.

19 Claims, 5 Drawing Sheets

WAFER LEVEL PACKAGING METHOD

BACKGROUND OF THE INVENTION

1. Field of the Invention

The present invention generally relates to a semiconductor packaging method, in particular, to a wafer level packaging method.

2. Description of Related Art

The wafer level packaging method has grown rapidly in the integrated circuit industry due to advantages in terms of the size of package structure as well as production time and cost. However, an un-bonded problem often occurs during a bonding step of the wafer level packaging method. To be more specific, a gap may exist between two bonded wafers at edge areas thereof. As a result, a yield of the wafer level packaging method may be lowered according to the un-bonded problem.

SUMMARY OF THE INVENTION

Accordingly, the present invention is directed to a wafer level packaging method that can avoid from the un-bonded problem.

The invention provides a wafer level packaging method including the following steps. A first wafer is bonded over a second wafer. A first grinding process is performed on the first wafer, to remove an upper chamfered edge of the first wafer and reduce a first thickness of the first wafer. A trimming process is performed on the first wafer, to remove a lower chamfered edge of the first wafer to form a trimmed first wafer. A second grinding process is performed on the trimmed first wafer, to reduce a second thickness of the trimmed first wafer.

According to an embodiment of the invention, the first grinding process may be stopped between the upper chamfered edge and the lower chamfered edge.

According to an embodiment of the invention, a ratio of an amount of the first thickness in the first grinding process with respect to an amount of the second thickness in the second grinding process may be ranged from 0.7 to 4.4.

According to an embodiment of the invention, an amount of the first thickness of the first wafer in the first grinding process may be 40% to 75% of an original thickness of the first wafer.

According to an embodiment of the invention, an amount of the second thickness of the trimmed first wafer in the second grinding process may be 17% to 58% of an original thickness of the first wafer.

According to an embodiment of the invention, the first grinding process and the second grinding process may respectively include a chemical mechanical polishing process.

According to an embodiment of the invention, a removal rate of the first grinding process may be higher than or equal to a removal rate of the second grinding process.

According to an embodiment of the invention, the second grinding process may sequentially include a coarse grinding process and a fine grinding process.

According to an embodiment of the invention, a ratio of a removal rate of the coarse grinding process with respect to a removal rate of the fine grinding process may be ranged from 1 to 20.

According to an embodiment of the invention, a method of performing the trimming process may include applying a mechanical method.

According to an embodiment of the invention, a trimmed width from an outermost edge of the first wafer by the trimming process may be ranged from 3.5 mm to 8.5 mm.

According to an embodiment of the invention, the wafer level packaging method may further include an etching process on the trimmed first wafer after the second grinding process.

The invention also provides a wafer level packaging method including the following steps. Bonding a first device wafer over a second device wafer. A first thinning process is performed, to remove an upper chamfered edge of the first device wafer, and reduce a first thickness of the first device wafer. A trimming process is performed, to remove a lower chamfered edge of the first device wafer to form a trimmed first device wafer. A second thinning process is performed, to reduce a second thickness of the trimmed first device wafer.

According to an embodiment of the invention, the first thinning process and the second thinning process may respectively include a chemical mechanical polishing process.

According to an embodiment of the invention, the first thinning process may be stopped between the upper chamfered edge and the lower chamfered edge.

The invention further provides a wafer level packaging method including the following steps. A first device wafer is bonded over a second device wafer by a hybrid bonding. A first grinding process is performed, to remove an upper chamfered edge of the first device wafer, and reduce a first thickness of the first device wafer. A trimming process is performed, to remove a lower chamfered edge of the first device wafer to form a trimmed first device wafer. A second grinding process is performed, to reduce a second thickness of the trimmed first device wafer.

According to an embodiment of the invention, the first device wafer and the second device wafer may respectively include a CMOS image sensor wafer or an image signal processor wafer.

According to an embodiment of the invention, a plurality of first conductive pads and a first insulating layer surrounding the plurality of first conductive pads may be formed at a bottom surface of the first device wafer. A plurality of second conductive pads and a second insulating layer surrounding the plurality of second conductive pads may be formed at a top surface of the second device wafer. The first conductive pads are electrically connected with the second conductive pads.

According to an embodiment of the invention, the step of which the first device wafer is bonded over the second device wafer by the hybrid bonding may include contacting the first insulating layer over the second insulating layer, then performing a heat treatment to electrically connect the first conductive pads with the second conductive pads.

According to an embodiment of the invention, the wafer level packaging method may further include sequentially forming a color filter and a plurality of micro lens on the first device wafer after the second grinding process.

As above, the first wafer and the second wafer are bonded together before the first wafer was trimmed. Therefore, an edge condition of the first wafer can be kept unchanged before the bonding step. As a result, an un-bonded problem at edge areas of the first wafer and the second wafer can be avoided, so that a yield of the wafer level packaging method can be improved. Furthermore, the trimming process performed to remove the lower chamfered edge of the first wafer precedes the second thinning process, such that a chipping problem of the first wafer can be avoided during the second thinning process. In addition, the devices in the first wafer can be protected from damaging during the second thinning process. Moreover, the wafer level packaging method of the invention is suitable for hybrid bonding two device wafers, and preventing both of the device wafers from the un-bonded problem and the chipping problem.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
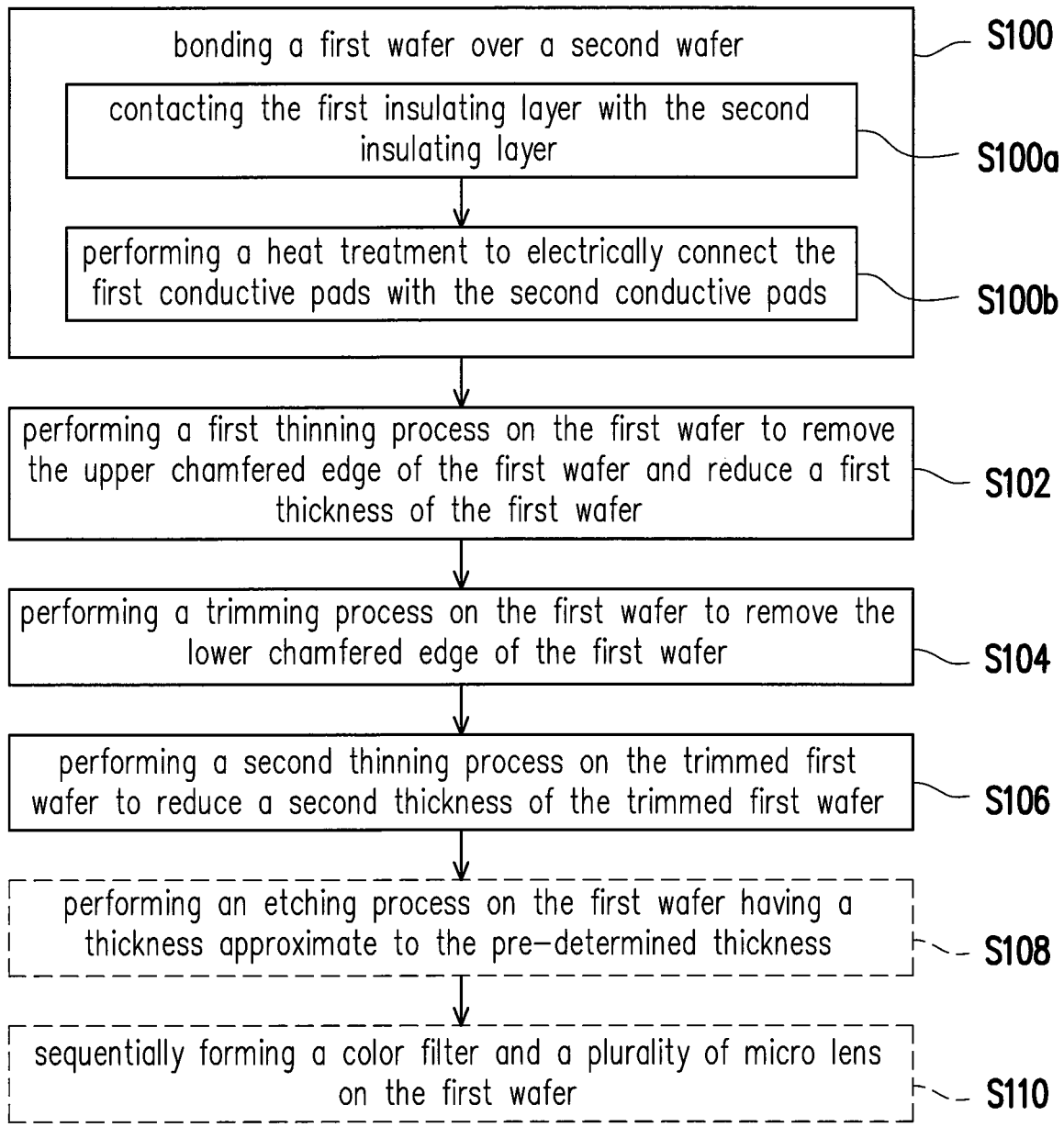
FIG. 1 is a flow chart illustrating a wafer level packaging method according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 3:
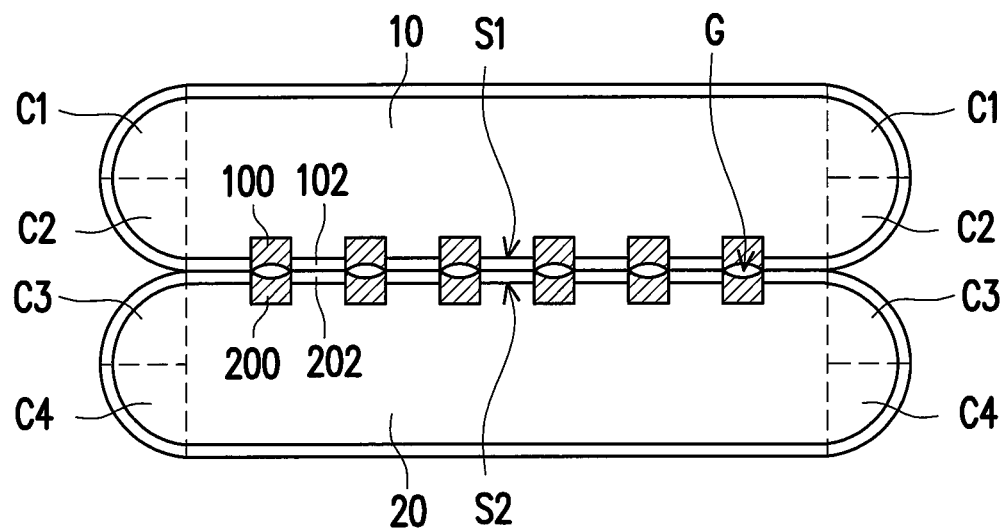
FIG. 3 is a schematic cross-sectional view illustrating a sub-step of a process of bonding a first wader over a second wafer according to an embodiment of the invention.
Figure 4:
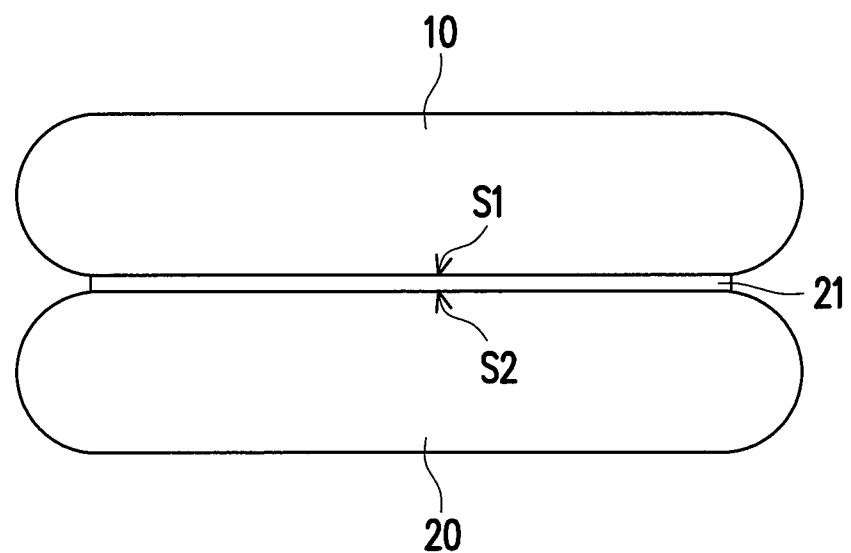
FIG. 4 is a schematic cross-sectional view illustrating a step of bonding a first wafer over a second wafer according to an alternative embodiment of the invention.

FIG. 1 is a flow chart illustrating a wafer level packaging method according to an embodiment of the invention. FIG. 2A through FIG. 2E are schematic cross-sectional views illustrating a wafer level packaging process according to an embodiment of the invention. FIG. 3 is a schematic cross-sectional view illustrating a sub-step of a process of bonding a first wader over a second wafer according to an embodiment of the invention. FIG. 4 is a schematic cross-sectional view illustrating a step of bonding a first wafer over a second wafer according to an alternative embodiment of the invention.

Figure 2A:
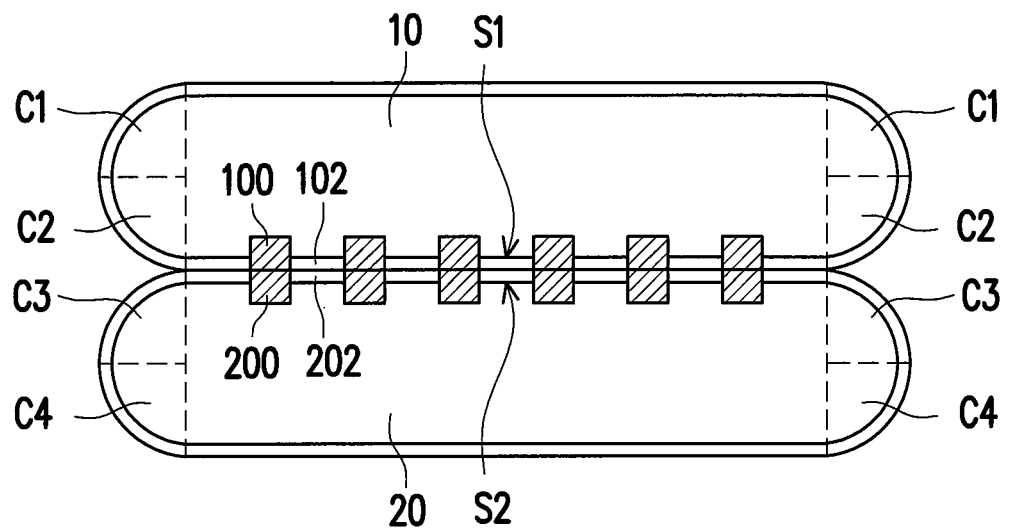
FIG. 2A through FIG. 2E are schematic cross-sectional views illustrating a wafer level packaging process according to an embodiment of the invention.

Referring to FIG. 1 and FIG. 2A, a wafer level packaging method of the present embodiment includes the following steps. A step S100 is performed, such that a first wafer 10 is bonded over a second wafer 20. The first wafer 10 may be a device wafer. A bottom surface S1 of the first wafer 10 is referred to an active surface of the first wafer 10. The first wafer 10 has an upper chamfered edge C1 and a lower chamfered edge C2 at a periphery area of the first wafer 10. As compared to the upper chamfered edge C1, the lower chamfered edge C2 may be closer to the active surface of the first wafer 10. A plurality of devices (not illustrated) in the first wafer 10 are formed near the bottom surface S1. The devices may include MOS transistors, thin film transistors, photodiodes, amplifiers, passive devices, light receiving structures, metal wirings, metal light shield layer or a combination thereof, for example. The second wafer 20 may be a device wafer or a handle wafer. In some embodiments, the second wafer 20 is a device wafer, and a top surface S2 is referred to an active surface thereof. Similarly, the second wafer 20 has an upper chamfered edge C3 and a lower chamfered edge C4 at a periphery area of the second wafer 20. A plurality of devices (not illustrated) in the second wafer 20 are formed near the top surface S2. The devices may include MOS transistors, thin film transistors, photodiodes, amplifiers, passive devices, light receiving structures, metal wirings, metal light shield layer or a combination thereof, for example.

In some embodiments, both of the first wafer 10 and the second wafer 20 are device wafers. For instance, the first wafer 10 and the second wafer 20 may respectively be a CMOS image sensor (CIS) wafer or an image signal processor (ISP) wafer. In some embodiments, the CIS may be a backside illumination type CIS. In these embodiments, the first wafer 10 and the second wafer 20 may respectively include a substrate on which the afore-mentioned devices are formed. The substrate may include a semiconductor substrate or a silicon-on-insulator (SOI) substrate. A material of the semiconductor substrate may include Si, SiGe, GaAs, SiC, InAs or InP. Furthermore, one of the first wafer 10 and the second wafer 20 is flipped and bonded over the other one, in order to form an electrical connection therebetween.

In addition, a plurality of first conductive pads 100 and a first insulating layer 102 surrounding the first conductive pads 100 may be formed at the bottom surface S1 of the first wafer 10. Similarly, a plurality of second conductive pads 200 and a second insulating layer 202 surrounding the second conductive pads 200 may be formed at the top surface S2 of the second wafer 20. Materials of the first conductive pads 100 and the second conductive pads 200 may respectively include a metal such as Cu, Al, Ti, Ni, W or a combination thereof as a metal alloy. Materials of the first insulating layer 102 and the second insulating layer 202 may respectively include inorganic materials such as silicon oxide, silicon nitride, silicon carbonitride, silicon oxynitride or a combination thereof, as well as organic materials or polymers such as polyimide (PI). Moreover, barrier layers (not illustrated) may be respectively formed between the first conductive pads 100 and the first insulating layer 102, and between the second conductive pads 200 and the second insulating layer 202. Materials of the barrier layers may include Ta, Ni, W, Ti, TaN, WN, TiN or a combination thereof.

Referring to FIG. 3, a method of bonding the first wafer 10 over the second wafer 20 in the step S100 may include the following sub-steps. A sub-step S100a is performed, such that the first insulating layer 102 is contacted with the second insulating layer 202 therebelow. In particular, a portion of the first insulating layer 102 at the bottom surface S1 of the first wafer 10 is contacted with a portion of the second insulating layer 202 at the top surface S2 of the second wafer 20. In the sub-step S100a, the first conductive pads 100 may not be completely contacted with the second conductive pads 200. Instead, a gap G may be existed between each of the first conductive pads 100 and the corresponding second conductive pad 200. In other words, a dishing effect may be occurred during the formation of the first conductive pads 100 and the second conductive pads 200. Accordingly, a localized dishing may be observed on each of the first conductive pads 100 and each of the second conductive pads 200, so as to form the gap G therebetween.

Afterward, a sub-step S100b is performed, such that a heat treatment is performed to electrically connect the first conductive pads 100 with the second conductive pads 200 as shown in FIG. 2A. The heat treatment is such as an annealing process. In the sub-step S100b, the first conductive pads 100 and the second conductive pads 200 are expanded due to the heat treatment, so as to be contacted with each other. In addition, a coefficient of thermal expansion (CTE) of a metal or a metal alloy is greater than a CTE of an insulating material. Thereby, an amount of expansion of the first conductive pads 100 or the second conductive pads 200 would be greater than an amount of expansion of the first insulating layer 102 or the second insulating layer 202. The bonding process electrically connecting two device wafers is also referred as a hybrid bonding process.

Referring to FIG. 4, in alternative embodiments, the second wafer 20 may be a handle wafer. A material of the handle wafer may include Si, sapphire or silicon carbide. In these embodiments, the first wafer 10 may be bonded over the second wafer 20 without forming an electrical connection therebetween. The first wafer 10 may be bonded to the second wafer 20 through an adhesive layer 21. For instance, the adhesive layer may be a light to heat conversion (LTHC) adhesive layer or other suitable adhesive layers.

The present embodiment will be illustrated by both the first wafer 10 and the second wafer 20 are device wafers.

Figure 2B:
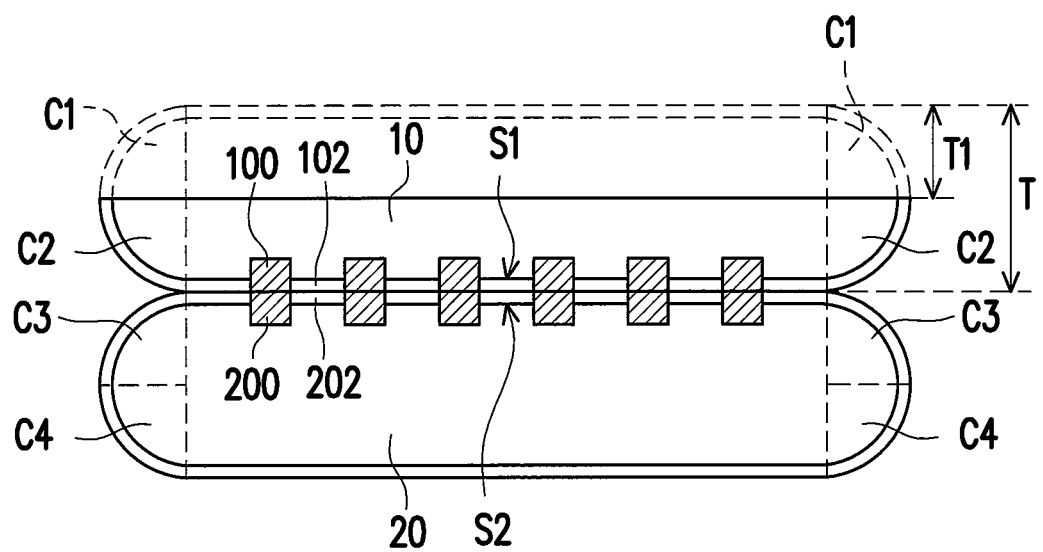

Referring to FIG. 1 and FIG. 2B, a step S102 is performed, such that a first thinning process is performed on the first wafer 10 to remove the upper chamfered edge C1 of the first wafer 10 and reduce a first thickness T1 of the first wafer 10. A method of the first thinning process may include a grinding process. For example, the grinding process may include a chemical mechanical polishing (CMP) process. In some embodiments, the first thinning process may be stopped between the upper chamfered edge C1 and the lower chamfered edge C2. In alternative embodiments, an amount of the first thickness T1 of the first wafer 10 in the first thinning process may be 40% to 75% of an original thickness T of the first wafer 10. For example, the original thickness T of the first wafer may be 775 μm, and the first thickness T1 may be ranged from 310 μm to 581 μm.

Figure 2C:
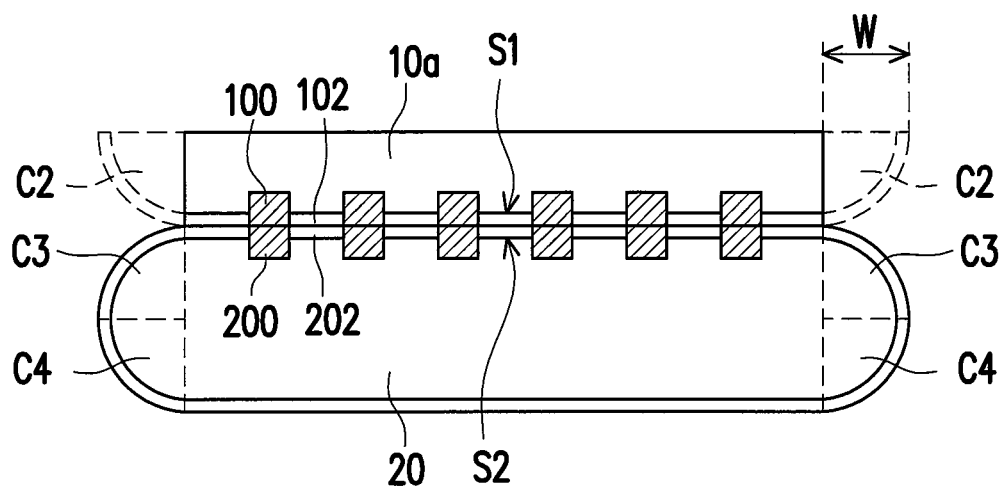

Referring to FIG. 1 and FIG. 2C, a step S104 is performed, such that a trimming process is performed on the first wafer 10 to remove the lower chamfered edge C2 of the first wafer 10. Thus, a trimmed first wafer 10a has been formed. A method of the trimming process may include a mechanical method. For instance, the trimming process may be carried out by applying a grinding wheel (or blade) to remove the lower chamfered edge C2. In other words, the lower chamfered edge C2 of the first wafer 10 may be trimmed downwardly. In addition, the trimming process may be stopped at the second wafer 20. In some embodiments, an endpoint of the trimming process is at the second insulating layer 202 at the top surface S2 of the second wafer 20. Furthermore, a trimmed width W from an outermost edge of the first wafer 10 by the trimming process may be ranged from 3.5 mm to 8.5 mm.

Figure 2D:
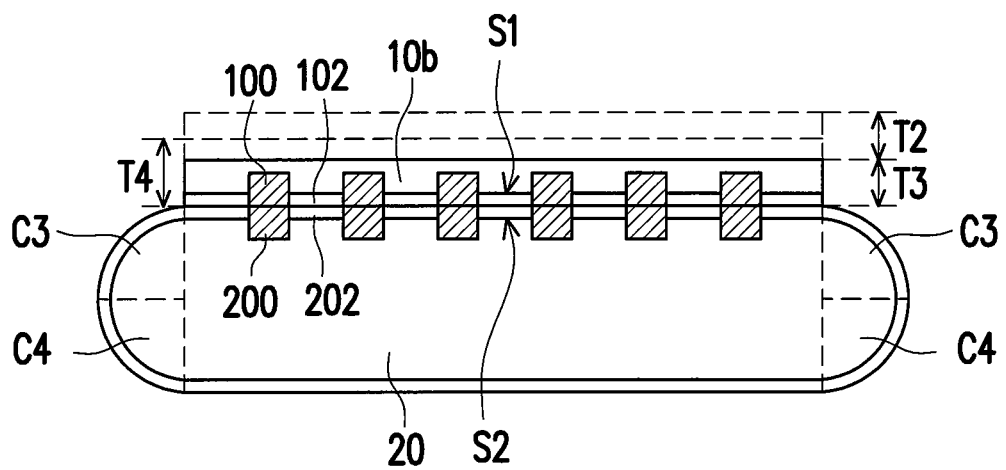

Referring to FIG. 1 and FIG. 2D, a step S106 is performed, such that a second thinning process is performed on the trimmed first wafer 10a to reduce a second thickness T2 of the trimmed first wafer 10a. As a result, a first wafer 10b having a third thickness T3 approximate to a pre-determined thickness has been formed. In some embodiments, the third thickness T3 of the first wafer 10b may be ranged from 15 μm to 60 μm. In other words, an amount of the second thickness T2 in the second thinning process may be 17% to 58% of the original thickness T of the first wafer 10 (FIG. 2B). For example, the second thickness T2 may be ranged from 134 μm to 450 μm. As similar to the first thinning process, the second thinning process may include a grinding process, such as a CMP process. A ratio of an amount of the first thickness T1 in the first thinning process with respect to the amount of the second thickness T2 in the second thinning process may be ranged from 0.7 to 4.4. In addition, a removal rate of the first thinning process may be higher than or equal to a removal rate of the second thinning process. In some embodiments, the second thinning process may include a coarse grinding process followed by a fine grinding process. Particularly, a removal rate of the coarse grinding may be greater than or equal to a removal rate of the fine grinding. For instance, a ratio of the removal rate of the coarse grinding process with respect to the removal rate of the fine grinding process may be ranged from 1 to 20. In some embodiments, a thickness of the first trimmed wafer 10a is reduced to a fourth thickness T4 that is ranged from 100 μm to 150 μm after the coarse grinding process, and then further reduced to the third thickness T3 of 15 μm to 60 μm after the fine grinding process, so as to form the first wafer 10b.

Afterward, a step S108 may be selectively performed after the step S106, such that an etching process is performed on the first wafer 10b having a thickness (i.e., the third thickness T3) approximate to the pre-determined thickness. Specifically, the etching process may be an isotropic etching process, such as a wet etching process. For example, an etching solution applied in the etching process may include KOH, ethylene diamine pyrochatecol (EDP) or tetramethylammonium hydroxide (TMAH). However, the etching solution applied in the etching process may be selected according to the material of the first wafer 10, the invention is not limited thereto. By selecting an appropriate etching solution and/or controlling an etching rate of the etching process, a flatness of a top surface of the first wafer 10b can be improved. In addition, the third thickness T3 of the first wafer 10b can be reduced finely to further approximate to the pre-determined thickness.

Figure 2E:
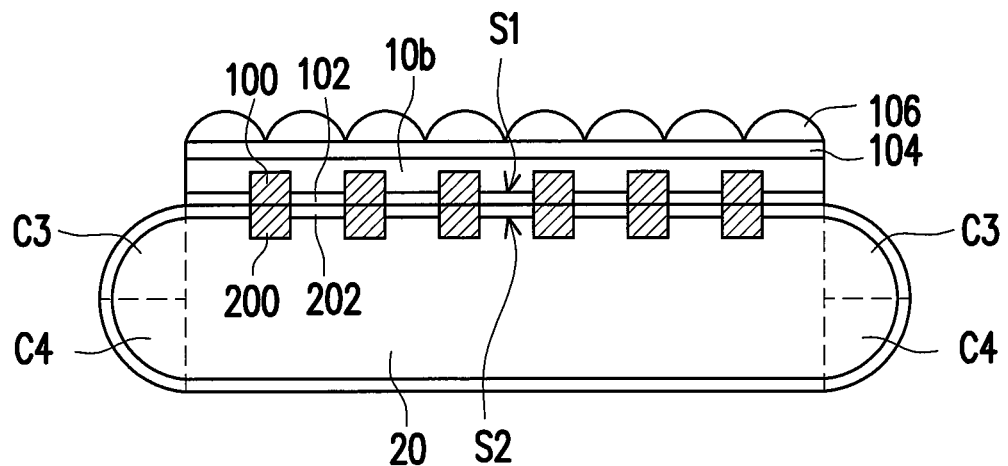

Referring to FIG. 2E, a step S110 may be selectively performed, such that a color filter 104 and a plurality of micro lens 106 may be sequentially formed on the first wafer 10b. The color filter 104 may consist a plurality of color filter units 104a. The color filter units 104a may include red filter units, green filter units and blue filter units. Each of the micro lens 106 may have a curved surface, so as to produce a light condensing result.

Based on the foregoing, the first wafer and the second wafer are bonded together before the first wafer was trimmed. Therefore, an edge condition of the first wafer can be kept unchanged before the bonding step. As a result, an un-bonded problem at edge areas of the first wafer and the second wafer can be avoided, so that a yield of the wafer level packaging method can be improved. Furthermore, the trimming process performed to remove the lower chamfered edge of the first wafer precedes the second thinning process, such that a chipping problem of the first wafer can be avoided during the second thinning process. In addition, the devices in the first wafer can be protected from damaging during the second thinning process. Moreover, the wafer level packaging method of the invention is suitable for hybrid bonding two device wafers, and preventing both of the device wafers from the un-bonded problem and the chipping problem.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level packaging method, comprising:
    bonding a first wafer over a second wafer;
    performing a first grinding process on the first wafer, to remove an upper chamfered edge of the first wafer and reduce a first thickness of the first wafer;
    performing a trimming process on the first wafer, to remove a lower chamfered edge of the first wafer to form a trimmed first wafer, wherein the lower chamfered edge of the first wafer may be trimmed downwardly and stopped at the second wafer; and
    performing a second grinding process on the trimmed first wafer, to reduce a second thickness of the trimmed first wafer in its entire width,
    wherein a plurality of first conductive pads and a first insulating layer surrounding the plurality of first conductive pads are formed at a bottom surface of the first wafer, a plurality of second conductive pads and a second insulating layer surrounding the plurality of second conductive pads are formed at a top surface of the second wafer, and the first conductive pads are electrically connected with the second conductive pads.

2. The wafer level packaging method according to claim 1, wherein the first grinding process is stopped between the upper chamfered edge and the lower chamfered edge.

3. The wafer level packaging method according to claim 1, wherein a ratio of the first thickness with respect to the second thickness is ranged from 0.7 to 4.4.

4. The wafer level packaging method according to claim 3, wherein the first thickness of the first wafer is 40% to 75% of an original thickness of the first wafer.

5. The wafer level packaging method according to claim 3, wherein the second thickness of the trimmed first wafer is 17% to 58% of an original thickness of the first wafer.

6. The wafer level packaging method according to claim 1, wherein the first grinding process and the second grinding process comprise a chemical mechanical polishing process respectively.

7. The wafer level packaging method according to claim 1, wherein a removal rate of the first grinding process is higher than or equal to a removal rate of the second grinding process.

8. The wafer level packaging method according to claim 1, wherein the second grinding process sequentially comprises a coarse grinding process and a fine grinding process.

9. The wafer level packaging method according to claim 8, wherein a ratio of a removal rate of the coarse grinding process with respect to a removal rate of the fine grinding process is ranged from 1 to 20.

10. The wafer level packaging method according to claim 1, wherein a method of performing the trimming process comprises applying a mechanical method, wherein the trimming process is directly performed on the first wafer to remove the lower chamfered edge of the first wafer to form the trimmed first wafer directly after the first grinding process.

11. The wafer level packaging method according to claim 1, wherein a trimmed width from an outermost edge of the first wafer by the trimming process is ranged from 3.5 mm to 8.5 mm.

12. The wafer level packaging method according to claim 1, further comprising performing an etching process on the trimmed first wafer after the second grinding process.

13. A wafer level packaging method, comprising:
    bonding a first device wafer over a second device wafer;
    performing a first thinning process, to remove an upper chamfered edge of the first device wafer, and reduce a first thickness of the first device wafer;
    performing a trimming process, to remove a lower chamfered edge of the first device wafer to form a trimmed first device wafer, wherein the lower chamfered edge of the first wafer may be trimmed downwardly and stopped at the second wafer; and
    performing a second thinning process, to reduce a second thickness of the trimmed first device wafer, so that the trimmed first device wafer in entire width is thinned down to a third thickness,
    wherein a plurality of first conductive pads and a first insulating layer surrounding the plurality of first conductive pads are formed at a bottom surface of the first device wafer, a plurality of second conductive pads and a second insulating layer surrounding the plurality of second conductive pads are formed at a top surface of the second device wafer, and the first conductive pads are electrically connected with the second conductive pads.

14. The wafer level packaging method according to claim 13, wherein the first thinning process and the second thinning process respectively comprise a chemical mechanical polishing process.

15. The wafer level packaging method according to claim 13, wherein the first thinning process is stopped between the upper chamfered edge and the lower chamfered edge.

16. A wafer level packaging method, comprising:
    hybrid bonding a first device wafer over a second device wafer;
    performing a first grinding process, to remove an upper chamfered edge of the first device wafer, and reduce a first thickness of the first device wafer;
    performing a trimming process, to remove a lower chamfered edge of the first device wafer to form a trimmed first device wafer, wherein the lower chamfered edge of the first wafer may be trimmed downwardly and stopped at the second wafer; and
    performing a second grinding process, to reduce a second thickness of the trimmed first device wafer, so that the trimmed first device wafer in entire width is thinned down to a third thickness,
    wherein a plurality of first conductive pads and a first insulating layer surrounding the plurality of first conductive pads are formed at a bottom surface of the first device wafer, a plurality of second conductive pads and a second insulating layer surrounding the plurality of second conductive pads are formed at a top surface of the second device wafer, and the first conductive pads are electrically connected with the second conductive pads.

17. The wafer level packaging method according to claim 16, wherein the first device wafer and the second device wafer comprise a CMOS image sensor wafer or an image signal processor wafer.

18. The wafer level packaging method according to claim 16, wherein the step of hybrid bonding the first device wafer over the second device wafer comprises contacting the first insulating layer over the second insulating layer, then performing a heat treatment to electrically connect the first conductive pads with the second conductive pads.

19. The wafer level packaging method according to claim 16, further comprising sequentially forming a color filter and a plurality of micro lens on the first device wafer after the second grinding process.

* * * * *